United States Patent [19]

Fujikawa et al.

[11] Patent Number: 5,225,286
[45] Date of Patent: Jul. 6, 1993

[54] DIELECTRIC FILM

[75] Inventors: Hisayoshi Fujikawa, Aichi; Yasunori Taga, Nagoya; Makio Iida, Ichinomiya, all of Japan

[73] Assignees: Kabushiki Kaisha Toyota Chuo Kenkyusho, Aichi; Nippondenso Co., Ltd., Kariya, both of Japan

[21] Appl. No.: 897,818

[22] Filed: Jun. 12, 1992

[30] Foreign Application Priority Data

Jun. 13, 1991 [JP] Japan .................................. 3-142115

[51] Int. Cl.⁵ .............................................. B32B 17/06
[52] U.S. Cl. ...................... 428/426; 428/336; 428/432; 428/469; 428/472; 428/688; 428/689; 428/697; 428/701; 428/702; 428/901; 428/917; 174/250; 174/255; 257/2; 257/499
[58] Field of Search ................... 174/250, 255; 106/286.1; 428/336, 469, 472, 688, 689, 697, 701, 702, 901, 917, 426, 432; 315/169.3; 357/2, 10, 17, 41, 63

[56] References Cited

U.S. PATENT DOCUMENTS

| | | | |
|---|---|---|---|
| 4,112,193 | 9/1978 | Higuchi | 428/428 |
| 4,734,340 | 3/1988 | Saito et al. | 428/701 |
| 4,961,994 | 10/1990 | Cariou | 428/469 |
| 4,973,526 | 11/1990 | Haluska | 428/702 |
| 5,064,729 | 11/1991 | Zegarski | 428/690 |

FOREIGN PATENT DOCUMENTS 60-57959  4/1985  Japan .

*Primary Examiner*—Ellis P. Robinson
*Assistant Examiner*—Timothy M. Speer
*Attorney, Agent, or Firm*—Oblon, Spivak, McClelland, Maier & Neustadt

[57]  ABSTRACT

A tantalum oxide dielectric film includes tantalum oxide ($Ta_2O_5$) as a major component, and at least one oxide selected from the group consisting of yttrium oxide ($Y_2O_3$), tungsten oxide ($WO_3$) and niobium oxide ($Nb_2O_5$). This dielectric film exhibits a remarkably improved dielectric constant and insulation property because it is a composite oxide film in which $Ta_2O_5$ is compounded with $Y_2O_3$, $WO_3$ or $Nb_2O_5$. For example, when the dielectric film is used as a capacitor film, the capacitor film exhibits a figure of merit, i.e., a product of a dielectric constant and an insulation property, approximately twice the silicon oxide ($SiO_2$) film which is used widely for the purpose at present.

8 Claims, 10 Drawing Sheets

DIELECTRIC FILM

BACKGROUND OF THE INVENTION

1. Field of the Invention

The present invention relates to a dielectric film which comprises tantalum oxide ($Ta_2O_5$) as a major component, and which is applicable to a dielectric film for an electroluminescent (hereinafter abbreviated to "EL") display device, an electrochromic (hereinafter abbreviated to "EC") display device, a large-scale integrated (hereinafter abbreviated to "LSI") circuit, or the like.

2. Description of the Related Art

As the LSI circuit technologies and the display device technologies have been developing, there has been arising need, ever increasing day by day, for a dielectric film material which has a high dielectric constant as well as a high insulation property. For instance, silicon dioxide ($SiO_2$) has been used extensively in most of the dielectric films for the capacitors which are used in the field of the LSI circuits conventionally. However, as ICs have become highly integrated, electronics engineers have longed for a material which has a higher dielectric constant than $SiO_2$ does and which has a higher insulation property so as to ensure a higher reliability. Likewise, there has been such need also in the fields of the EL display devices, the EC display devices, and so on.

However, no materials have been available so far which have high dielectric constants and at the same which maintain high insulation properties. Accordingly, in order to satisfy this requirement, there was proposed a stacked construction in which different types of dielectric films were stacked. Despite the proposal, the stacked construction resulted in complicated manufacturing processes. Consequently, $SiO_2$ is used in most (99% or more) of the LSI circuits, EL display devices, the EC display devices, or the like at present.

In addition, tantalum oxide ($Ta_2O_5$) has a dielectric constant which is 7 to 8 times that of $SiO_2$, and accordingly there was a tryout in which $Ta_2O_5$ was used independently. However, this $Ta_2O_5$ film exhibited a large leakage current. The greater the amount of current leakage, the smaller the insulation property becomes. As a result, the $Ta_2O_5$ film suffered from the problem that it should be formed in a large thickness. Hence, as disclosed in Japanese Unexamined Patent Publication (Kokai) No. 45,008/1985, Japanese Unexamined Patent Publication (Kokai) No. 57,959/1985 and Japanese Unexamined Patent Publication (Kokai) No. 17,177/1987, a couple of methods have been proposed in which aluminum (Al), $SiO_2$, titanium dioxide ($TiO_2$), silicon nitride ($Si_3N_4$), or the like is added to or stacked on the $Ta_2O_5$ film. However, no particular advantages are gained by these films. Further, the manufacturing processes required to form the films are complicated, especially the manufacture of stacked films.

SUMMARY OF THE INVENTION

The present invention has been developed in view of the circumstances described above. It is an object of the present invention to provide a dielectric film having a high dielectric constant and a high insulation property. In the dielectric film according to the present invention, $Ta_2O_5$ is included as a major component and a third element or compound other than the aforementioned Al, $SiO_2$, $TiO_2$, $Si_3N_4$ is added, thereby making the present dielectric film composite, improving the film qualities of the present dielectric film and enhancing the insulation property thereof while keeping the high dielectric constant of $Ta_2O_5$.

When considering the oxide like $Ta_2O_5$ in particular, the causes of the dielectric breakdown in the above-described $Ta_2O_5$ film are assumed to result from defects in the film. These defects are believed to be the lack of oxygen atoms, the presence of micro-fine cracks due to the stress in the film, and so on. All of these defects cause electronic conduction which results in the dielectric breakdown.

The present invention has been completed as a result of the following investigation: A variety of the third elements which were deemed to be effective in eliminating these kinds of defects at micro- and macro-levels was selected and added to $Ta_2O_5$ so as to form oxide films, and the resulting oxide films were examined to determined how to inhibit deterioration of the insulating properties.

A dielectric film according to the present invention comprises:

tantalum oxide ($Ta_2O_5$) as a major component; and at least one oxide selected from the group consisting of yttrium oxide ($Y_2O_3$), tungsten oxide ($WO_3$) and niobium oxide ($Nb_2O_5$).

Thus, in the present dielectric film, at least one oxide selected from the group consisting of $Y_2O_3$, $WO_3$ and $Nb_2O_5$ is added into the matrix of tantalum oxide so as to form a composite film, thereby improving the insulation property of the tantalum oxide film and inhibiting the relative dielectric constant thereof from deteriorating. As a result, a FIGURE of merit, which is expressed by a product of a dielectric breakdown field and a relative dielectric constant of the present dielectric film, has been improved with respect to that of the simple tantalum oxide dielectric film. The present inventors have taken this figure of merit as a criterion for evaluating the performances of the present dielectric film, and they have investigated it because dielectric films are not only intended for capacitors, insulating films and the like in LSI circuits and because dielectric films are required to satisfy a predetermined dielectric breakdown field requirement and a predetermined relative dielectric constant requirement at the same time.

Figure 2:
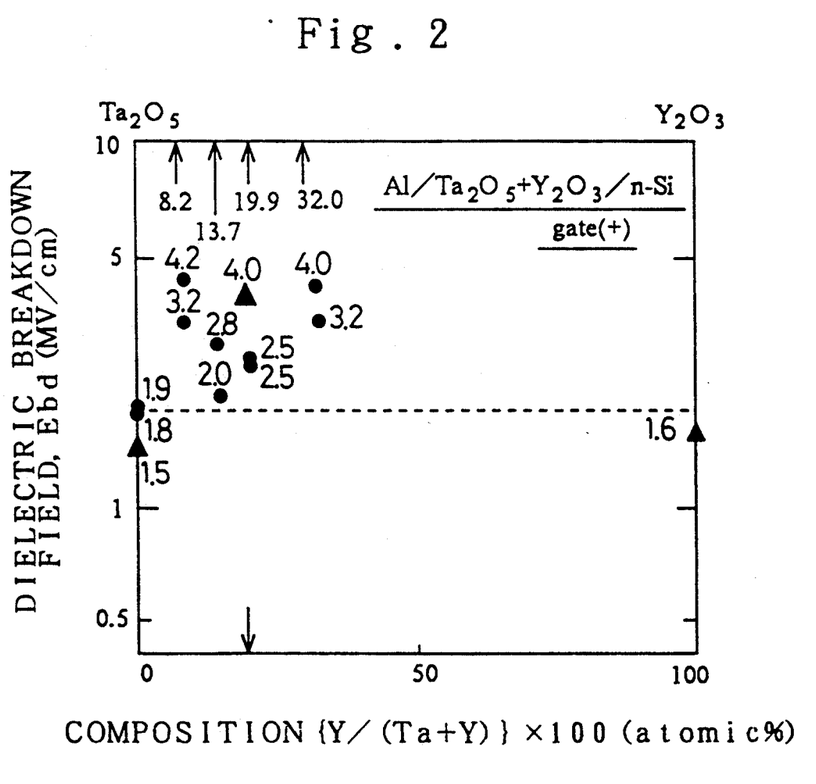
FIG. 2 is a scatter diagram which illustrates the relationships between the dielectric breakdown fields of tantalum oxide dielectric films including yttrium and the addition amounts of yttrium therein.

FIG. 2 is a scatter diagram which illustrates the relationships between the compositions of dielectric films and the dielectric breakdown fields thereof. The dielectric films were formed by adding $Y_2O_3$ into tantalum oxide. In FIG. 2, the axis of ordinate expresses the dielectric breakdown field $E_{bd}$ (in MV/cm) of the dielectric films, and the axis of abscissas expresses the atomic percent (hereinafter abbreviated to atomic %) of yttrium in the dielectric films. Hereinafter, an atomic % of yttrium in a dielectric film means the atomic % of yttrium elements in the dielectric film when the sum of tantalum elements and yttrium elements therein is taken as 100 atomic %. Also in FIG. 2, the solid triangle (▲) marks denote the results of the measurements on the dielectric films having thicknesses of 700 to 1000 angstroms, and the solid circle (●) marks denote the results of the measurements on the dielectric films having thicknesses of 100 to 300 angstroms.

As can be appreciated from FIG. 2, the dielectric films exhibited the dielectric breakdown fields higher than the simple tantalum oxide film did when yttrium is added in an amount of 8 to 32 atomic % with respect to the sum of tantalum and yttrium therein taken as 100 atomic %. The dielectric breakdown field exhibited by the simple tantalum oxide film is illustrated with a horizontal broken line in FIG. 2. Hence, the results of the measurements tell us that it is effective to add yttrium into the dielectric films in an amount of a predetermined atomic % in order to increase the dielectric breakdown fields of the dielectric films.

Figure 5:
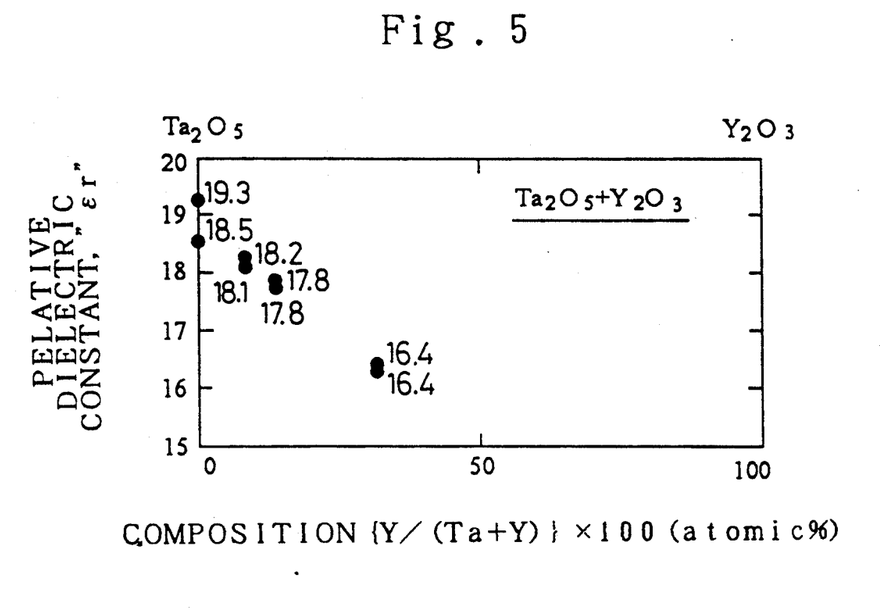
FIG. 5 is a scatter diagram which illustrates the relationships between the relative dielectric constants of the tantalum oxide dielectric films including yttrium and the addition amounts of yttrium therein.

Further, FIG. 5 is a scatter diagram which illustrates the relationships between the compositions of the same dielectric films and the relative dielectric constants thereof. In FIG. 5, the axis of ordinate expresses the relative dielectric constant "$\epsilon_r$" of the dielectric films, and the axis of abscissas expresses the atomic % of yttrium in the dielectric films. In FIG. 5, however, the solid circle (●) marks denote the results of the measurements on the dielectric films having thicknesses of 100 to 300 angstroms. As can be noted from FIG. 5, the relative dielectric constant "$\epsilon_r$" decreases gradually as the yttrium addition amount increases, but the degree of the decrement is relatively less.

Figure 8:
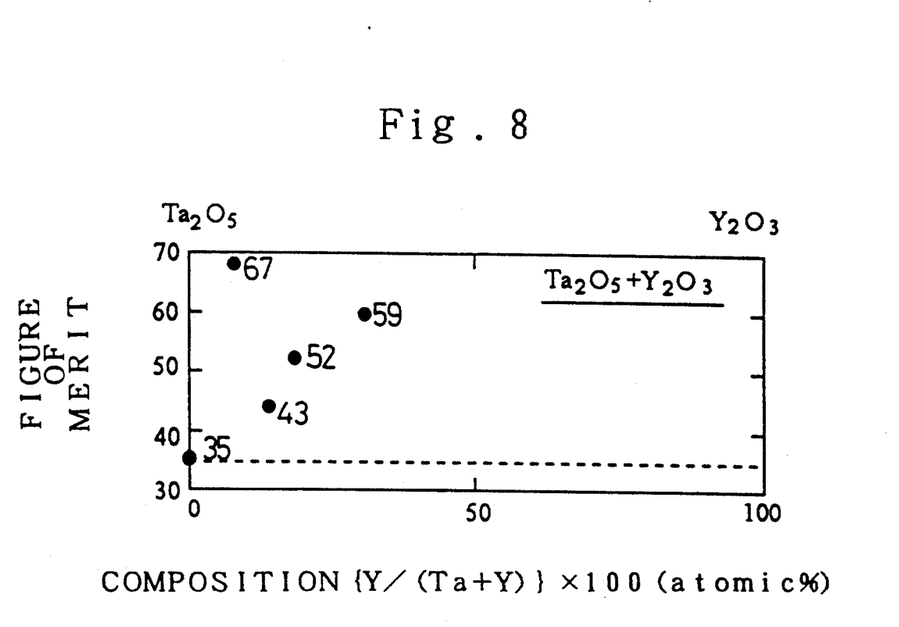
FIG. 8 is a scatter diagram which illustrates the relationships between the figures of merit of the tantalum oxide dielectric films including yttrium and the addition amounts of yttrium therein.

Furthermore, FIG. 8 is a scatter diagram which illustrates the relationships between the compositions of the same dielectric films and the figures of merit thereof expressed by the products of the dielectric breakdown fields and the relative dielectric constants. In FIG. 8, the axis of ordinate expresses the figure of merit, and the axis of abscissas expresses the atomic % of yttrium in the dielectric films. In FIG. 8, however, the solid circle (●) marks denote the results of the measurements on the dielectric films having thicknesses of 100 to 300 angstroms. As can be understood from FIG. 8, the dielectric films exhibited the figures of merit higher than that of the simple tantalum oxide film, which is illustrated with a horizontal broken line, because the dielectric constants decreased in a lesser degree. Therefore, when a tantalum oxide dielectric film is formed by compounding yttrium into the simple tantalum oxide dielectric film, preferably in the amount of 8 to 32 atomic %, the dielectric breakdown field of the tantalum oxide dielectric film can be enhanced while suppressing the problems associated with the simple tantalum dielectric film to the minimum degree.

Figure 3:
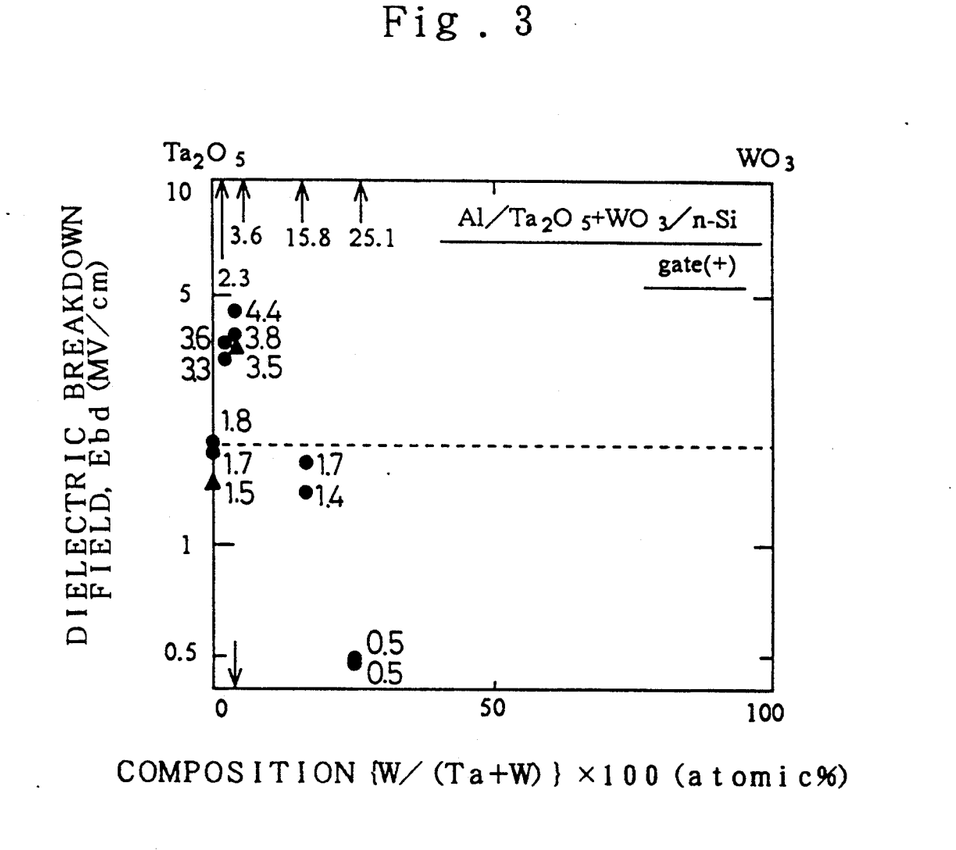
FIG. 3 is a scatter diagram which illustrates the relationships between the dielectric breakdown fields of tantalum oxide dielectric films including tungsten and the addition amounts of tungsten therein.

Moreover, the dielectric field breakdown field strength characteristic and the relative dielectric constant characteristic of another dielectric film will be hereinafter described which were formed by adding $WO_3$ instead of $Y_2O_3$ into the simple tantalum oxide dielectric film. FIG. 3 is a scatter diagram which illustrates how the dielectric breakdown fields of the dielectric films correlated with the addition amounts of tungsten. In FIG. 3, the axis of ordinate expresses the dielectric breakdown field $E_{bd}$ (in MV/cm) of the dielectric films, and the axis of abscissas expresses the atomic % of tungsten in the dielectric films. Hereinafter, an atomic % of tungsten in a dielectric film means the atomic % of tungsten elements in the dielectric film when the sum of tantalum elements and tungsten elements therein is taken as 100 atomic %. Similarly to FIG. 2, in FIG. 3, the solid triangle (▲) marks denote the results of the measurements on the dielectric films having thicknesses of 700 to 1000 angstroms, and the solid circle (●) marks denote the results of the measurements on the dielectric films having thicknesses of 100 to 300 angstroms.

As can be appreciated from FIG. 3, the dielectric breakdown fields of the dielectric films were higher than that of the simple tantalum oxide dielectric film (illustrated with a horizontal broken line in FIG. 3) when tungsten was added in an amount of 2 to 4 atomic % with respect to the sum of tantalum and tungsten therein taken as 100 atomic %. However, the dielectric films exhibited the dielectric breakdown fields lower than the simple tantalum oxide film did (illustrated with the horizontal broken line in FIG. 3) when the tungsten addition amount was increased to 15 atomic % with respect to the sum of tantalum and tungsten therein taken as 100 atomic %.

Figure 6:
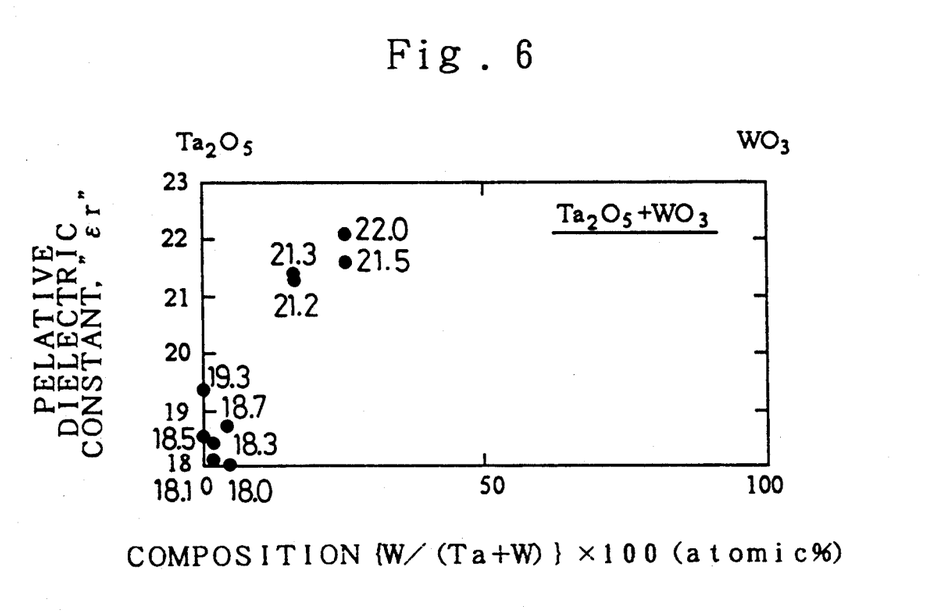
FIG. 6 is a scatter diagram which illustrates the relationships between the relative dielectric constants of the tantalum oxide dielectric films including tungsten and the addition amounts of tungsten therein.
Figure 9:
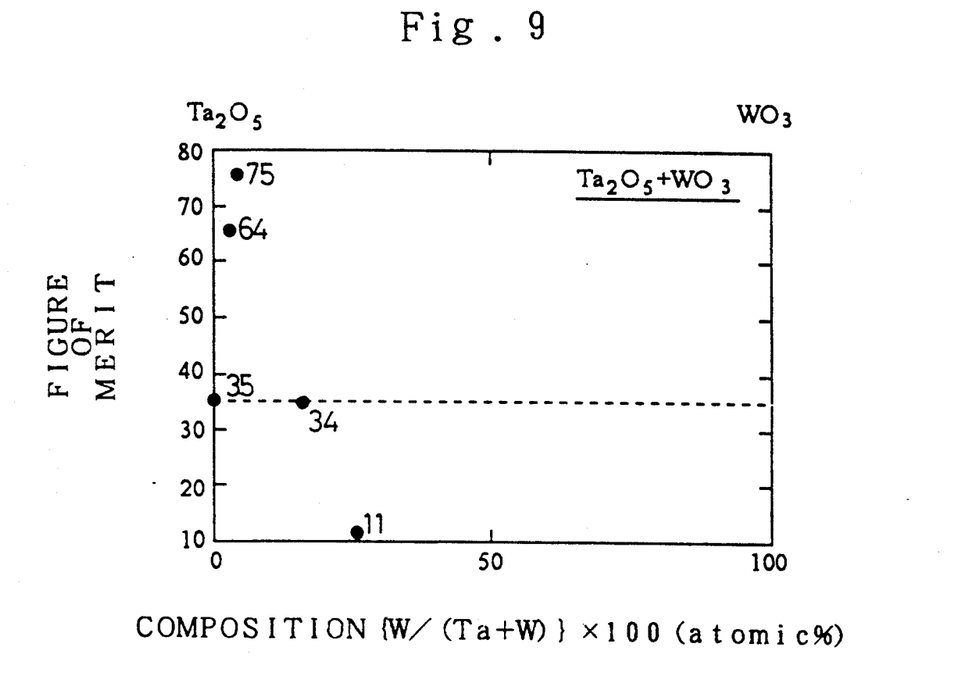
FIG. 9 is a scatter diagram which illustrates the relationships between the figures of merit of the tantalum oxide dielectric films including tungsten and the addition amounts of tungsten therein.

On the contrary, as illustrated in FIG. 6, the dielectric films exhibited higher relative dielectric constants when the tungsten was added more. In FIG. 6, the axis of ordinate expresses the relative dielectric constant "$\epsilon_r$" of the dielectric films, and the axis of abscissas expresses the atomic % of tungsten in the dielectric films. In FIG. 6, however, the solid circle (●) marks denote the results of the measurements on the dielectric films having thicknesses of 100 to 300 angstroms. Since the figure of merit is the product of the dielectric breakdown field and the relative dielectric constant, the dielectric breakdown field having a greater absolute value contributes more to the figure of merit. Hence, as can be seen from FIG. 9 which illustrates the figures of merit of the dielectric films, the figure of merit of the dielectric film with tungsten added in the amount of 15 atomic % was at a level equivalent to that of the simple tantalum oxide dielectric film. Therefore, tungsten is added into tantalum oxide, preferably in the amount less than 15 atomic %, in order to obtain satisfactory dielectric films. Here, it is further preferable to add tungsten into tantalum oxide in an amount of 2 to 4 atomic % with respect to the sum of tantalum and tungsten therein taken as 100 atomic %. In FIG. 9, the axis of ordinate expresses the figure of merit, and the axis of abscissas expresses the atomic % of tungsten in the dielectric films. In FIG. 9, however, the solid circle (●) marks denote the results of the measurements on the dielectric films having thicknesses of 100 to 300 angstroms.

Figure 4:
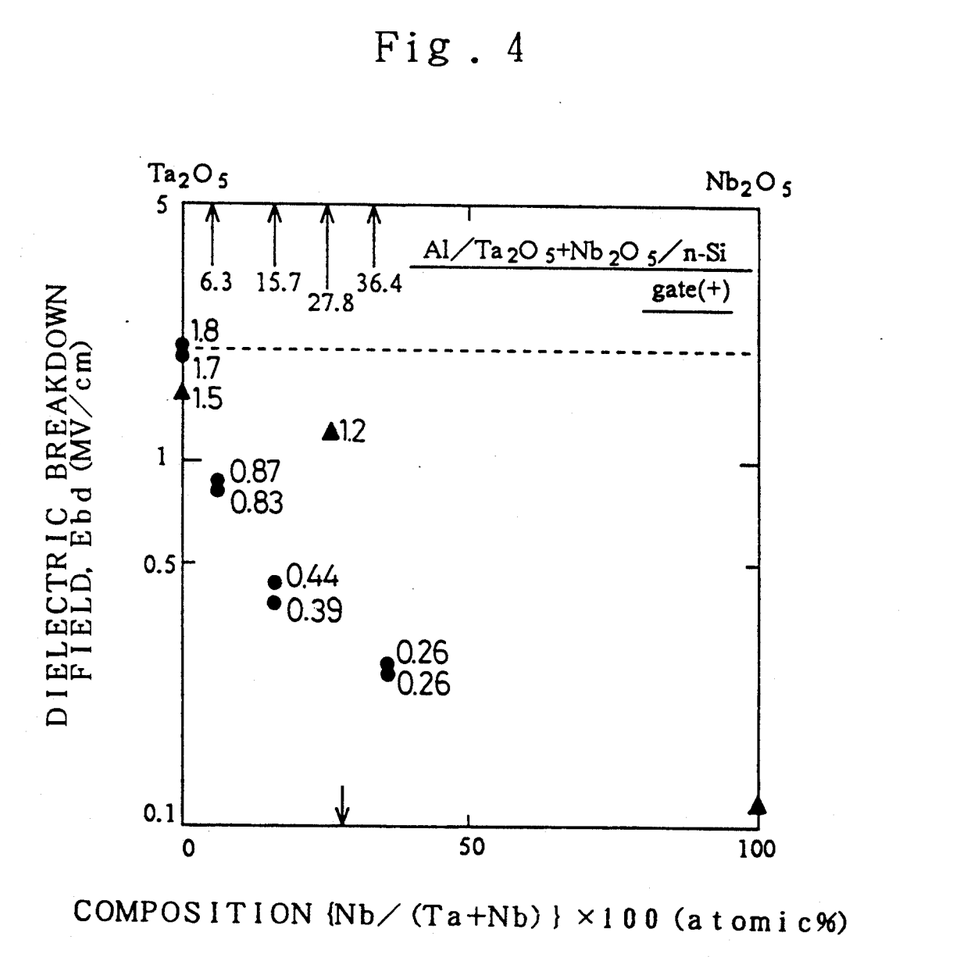
FIG. 4 is a scatter diagram which illustrates the relationships between the dielectric breakdown fields of tantalum oxide dielectric films including niobium and the addition amounts of niobium therein.

In addition, the dielectric breakdown field characteristic and the relative dielectric constant characteristic of still another dielectric film will be hereinafter described which were formed by adding $Nb_2O_5$ instead of $Y_2O_3$ into the simple tantalum oxide dielectric film. As illustrated in FIG. 4, the dielectric breakdown fields of the dielectric films degraded below that of the simple tantalum oxide dielectric film (illustrated with a horizontal broken line in FIG. 4). In FIG. 4, the axis of ordinate expresses the dielectric breakdown field $E_{bd}$ (in MV/cm) of the dielectric films, and the axis of abscissas expresses the atomic % of niobium in the dielectric films. Hereinafter, an atomic % of niobium in a dielectric film means the atomic % of niobium elements in the dielectric film when the sum of tantalum elements and niobium elements therein is taken as 100 atomic %. Similarly to FIG. 2, in FIG. 4, the solid triangle (▲) marks denote the results of the measurements on the dielectric films having thicknesses of 700 to 1000 angstroms, and the solid circle (●) marks denote the results of the measurements on the dielectric films having thicknesses of 100 to 300 angstroms.

Figure 7:
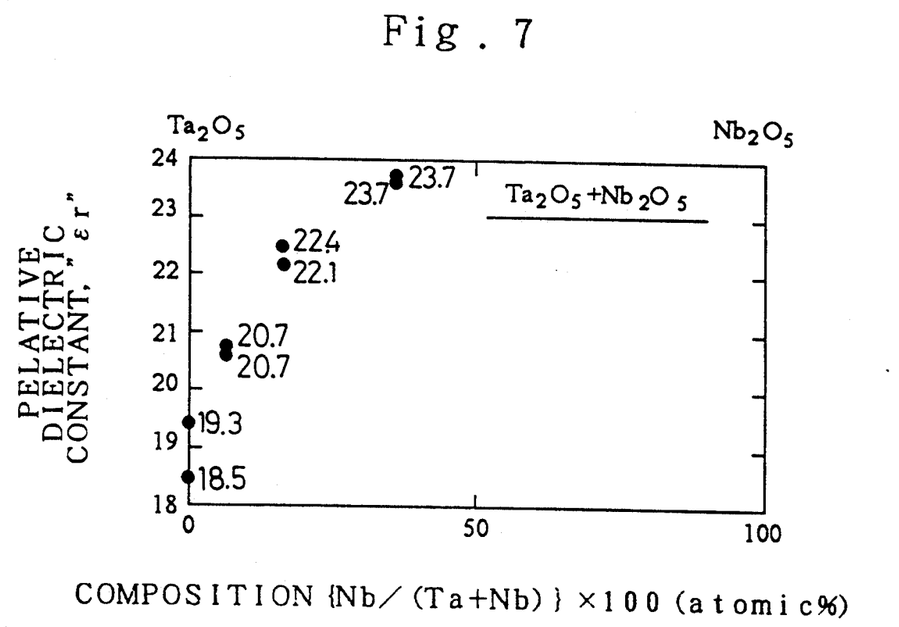
FIG. 7 is a scatter diagram which illustrates the relationships between the relative dielectric constants of the tantalum oxide dielectric films including niobium and the addition amounts of niobium therein.
Figure 10:
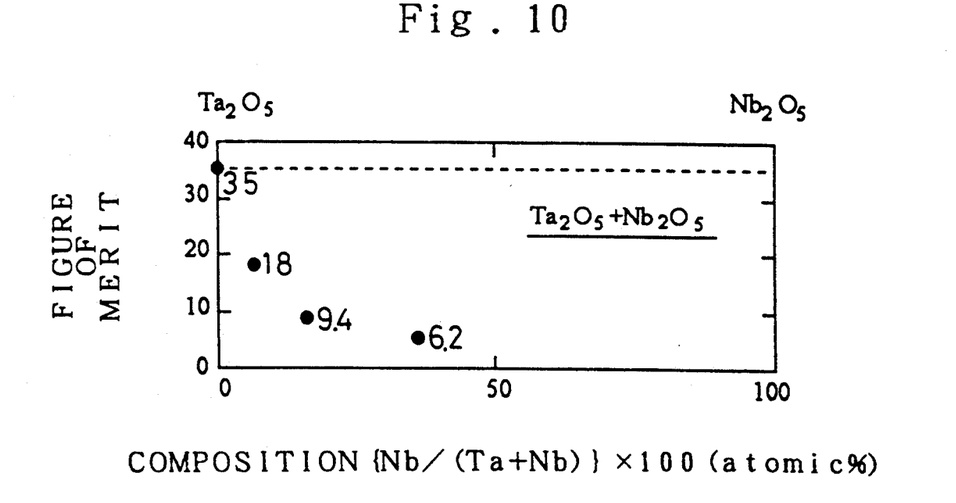
FIG. 10 is a scatter diagram which illustrates the relationships between the figures of merit of the tantalum oxide dielectric films including niobium and the addition amounts of niobium therein.

Moreover, as illustrated in FIG. 7, the dielectric films exhibited upgraded relative dielectric constants with respect to those of the tantalum oxide dielectric films including $Y_2O_3$ and $WO_3$. However, as illustrated in FIG. 10, the figures of merit of the dielectric films were lower than that of the simple tantalum oxide dielectric film (illustrated with a horizontal broken line in FIG. 10). As a result, it is apparent that the tantalum oxide dielectric films with niobium added are effective in the improvement on the relative dielectric constant of dielectric film. In FIG. 7, the axis of ordinate expresses the relative dielectric constant "$\epsilon_r$" of the dielectric films, and the axis of abscissas expresses the atomic % of niobium in the dielectric films, and in FIG. 10, the axis of ordinate expresses the figure of merit, and the axis of abscissas expresses the atomic % of niobium in the dielectric films. In FIGS. 7 and 10, however, the solid circle (●) marks denote the results of the measurements on the dielectric films having thicknesses of 100 to 300 angstroms.

Although the reasons are still unknown and under investigation, the relative dielectric constants and the dielectric breakdown fields of the dielectric films were improved and consequently the figures of merit thereof were upgraded when they are made composite by adding the two oxides of yttrium and tungsten into the simple tantalum oxide dielectric film. As a result, it is expected that such dielectric films can be used as high insulating films which are adapted for LSI circuits, EL display devices, EC display devices, and the like.

As has been described so far, the dielectric film according to the present invention is 9 composite of yttrium, tungsten or niobium in a matrix of tantalum oxide. In particular, in the present dielectric film in which $Y_2O_3$ or $WO_3$ is compounded so as to make itself composite, its dielectric breakdown field $E_{bd}$ is improved remarkably. As a result, when the present dielectric film is used as a capacitor film, the capacitor film exhibits a figure of merit approximately twice the $SiO_2$ film which is used widely for the purpose at present. Conventionally, the capacitors occupy approximately 20% of the total device area in the LSI circuits. Since the integration will surely intensify in future and it will be required to achieve a predetermined capacity in the crowded and limited small area, it is believed that the resulting improvement on the figure of merit will have significant meanings in the applications of the present dielectric film.

Moreover, in the case that niobium is added in the present dielectric film, the present dielectric film can be used for similar purposes when niobium is added so as to increase the relative dielectric constant "$\epsilon_r$" and at the same so as to keep the dielectric breakdown field to 1 MV/cm or more.

The mechanism how the characteristics are improved by the additive elements is unknown and its detailed explanation is still under investigation at present. However, it is believed that the additive elements reduce the micro-defects and macro-defects in the dielectric films according to the present invention.

For instance, when the present dielectric film is prepared by adding one of the aforementioned third elements into the simple tantalum oxide dielectric film and it is used as a dielectric film for an EL display device, the present dielectric film can be operated with a low voltage and its insulation property can be upgraded. As a result, these advantageous effects enable the dielectric film of the EL display device to operate for a longer period of time. In addition, when the present dielectric film is applied to a dielectric film for an EC display device, it is possible to sharply improve the memory capacity of the dielectric film of the EC display device. The memory capacity herein means the discoloring of the initial coloring as time passes.

BRIEF DESCRIPTION OF THE DRAWINGS

A more complete appreciation of the present invention and many of its advantages will be readily obtained as the same becomes better understood by reference to the following detailed description when considered in connection with the accompanying drawings and detailed specification, all of which forms a part of the disclosure.

DETAILED DESCRIPTION OF THE PREFERRED EMBODIMENTS

Having generally described the present invention, a further understanding can be obtained by reference to the specific preferred embodiments which are provided herein for purposes of illustration only and are not intended to limit the scope of the appended claims.

Preferred Embodiments

The present invention will be hereinafter described in detail with reference to preferred embodiments. The preferred embodiments of the dielectric film according to the present invention were prepared as follows by radio frequency magnetron simultaneous sputtering. Two kinds of targets were provided simultaneously in a radio frequency magnetron multiple sputtering apparatus, and the present dielectric films were formed by applying predetermined wattages to the sputtering apparatus. The input wattages were controlled so as to adjust and vary the composition ratios of the present dielectric films to be produced. A substrate comprising single crystal silicon was used, and it was kept at a temperature of 300° C. during the formation of the present dielectric films. The substrate was an n-type semiconductor, and it had a thickness of about 400 micrometers, a (100) Miller index and a specific resistivity of 0.02 ohm-cm. The targets were a $Ta_2O_5$ target and either one of the following oxide targets, e.g., a $Y_2O_3$ target, a $WO_3$ target and an $Nb_2O_5$ target, which were oxides of the above-described third composition elements. The present dielectric films were formed by sputtering under the following conditions: a sputtering gas pressure of $5 \times 10^{-3}$ Torr, a residual gas pressure of $3 \times 10^{-6}$ Torr and an argon sputtering atmosphere including oxygen in an amount of 30%. The thus prepared present dielectric films had thicknesses falling in a range of 200 to 1000 angstroms and included the third composition elements in various addition amounts as set forth in Table 1 and Table 2 below. The resulting present dielectric films were analyzed quantitatively for their compositions by the rutherford back scattering (hereinafter abbreviated to "RBS") analysis.

Figure 1:
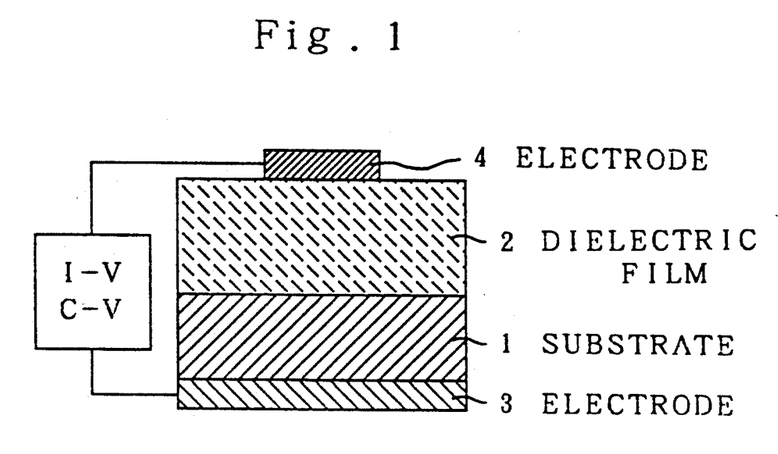
FIG. 1 is a schematic cross sectional view of a metal-insulator semiconductor (hereinafter abbreviated to "MIS") construction provided with aluminum electrodes, MIS construction which is adapted for evaluating performances of dielectric films.

The performances of the present dielectric films were evaluated with the MIS construction provided with aluminum electrodes as illustrated in FIG. 1. This MIS construction included an n-type semiconductor silicon substrate 1 which was doped with antimony (Sb), a present tantalum oxide dielectric film 2 which included one of the third element compositions in addition to tantalum oxide and which was formed on the top surface of the silicon substrate 1, an aluminum ohmic electrode 3 which was formed by vapor deposition on all over the rear surface of the silicon substrate 1, and an aluminum dot electrode 4 which was formed by mask vapor deposition on the top surface of the present tantalum oxide dielectric film 2 in a thickness of approximately 2000 angstroms and in an area of $1.9 \times 10^{-3}$ cm$^2$.

Thus, a circuit was disposed between the aluminum ohmic electrode 3 and and the aluminum dot electrode 4, and the I-V characteristic and the C-V characteristic of the present tantalum oxide dielectric film 2 were examined in order to obtain the relative dielectric constant of the present tantalum oxide dielectric film 2 and the dielectric breakdown field thereof. The dielectric breakdown field herein means an electric field at which the leakage current density reached 1 microampere/cm$^2$. Thus, the relative dielectric constant and the dielectric breakdown field of the present tantalum oxide dielectric film 2 were evaluated. As aforementioned, the figure of merit of the present tantalum oxide dielectric film 2 is the product of the dielectric breakdown field and the relative dielectric constant thereof, and it was calculated and evaluated accordingly. In this performance evaluation, the I-V (or the leakage current-applied voltage) characteristic of the present tantalum oxide dielectric film 2 was examined while the aluminum dot electrode 4 (or the gate electrode) was biased to positive (or (+)).

Table 1 summarizes the thus evaluated performances of the present tantalum oxide dielectric films 2 including $Ta_2O_5$ and $Y_2O_3$ or $WO_3$, and it sets forth the results of the performance evaluation on the addition amounts of the third element compositions, the film thicknesses, the dielectric breakdown fields $E_{bd}$, the relative dielectric constants "$\epsilon_r$" and the figures of merit which were obtained in the manner described above. Table 2 also summarizes the thus evaluated performances of the present tantalum oxide dielectric films 2 including $Ta_2O_5$ and $Nb_2O_5$ as well as those of simple dielectric films including either one of tantalum oxide, yttrium oxide, tungsten oxide or niobium oxide only, and it sets forth the results of the performance evaluation thereon which were obtained also in the manner described above.

TABLE 1

| Film Composition | Addition Amount (atomic %) | Film Thickness (angstrom) | Dielectric Breakdown Field $E_{bd}$ (MV/cm) | Relative Dielectric Constant "Er" | Figure of Merit |
|---|---|---|---|---|---|
| $Ta_2O_5$ + $Y_2O_3$ | 8.2 | 240 | 4.2, 3.2 | 18.2, 18.1 | 67 |
| | 13.7 | 240 | 2.8, 2.0 | 17.8, 17.8 | 43 |
| | 19.9 | 230 | 2.5, 2.5 | 20.8, 20.8 | 52 |
| | | 810 | 4.0 | 21.1 | 84 |
| | 32.2 | 240 | 4.0, 3.2 | 16.4, 16.4 | 59 |
| $Ta_2O_5$ + $WO_3$ | 2.3 | 230 | 3.6, 3.3 | 18.3, 18.1 | 64 |
| | 3.6 | 230 | 4.4, 3.8 | 18.7, 18.0 | 75 |
| | | 750 | 3.5 | 20.2 | 71 |
| | 15.8 | 300 | 1.7, 1.4 | 21.3, 21.2 | 34 |
| | 25.1 | 240 | 0.5, 0.5 | 22.0, 21.5 | 11 |

No definite relationships could be noted between the values of the dielectric breakdown fields, the film thicknesses and the third elements addition amounts. However, as illustrated in FIG. 2, when yttrium was the additive component, the present tantalum oxide dielectric films 2 exhibited the dielectric breakdown fields higher than that of the simple tantalum oxide dielectric film, independent of the yttrium addition amounts and the film thicknesses. Further, as illustrated in FIG. 3, when tungsten was the additive component, the present tantalum oxide dielectric films 2 exhibited the dielectric breakdown fields higher than that of the simple tantalum oxide dielectric film in a tungsten addition amount of 2.3 to 3.6 atomic % with respect to the sum of tantalum and tungsten therein taken as 100 atomic %, and trium and tungsten are added in the addition amounts which fall in the aforementioned ranges. That is to say, when the performances were compared in terms of the figures of merit, the characteristics of the present tantalum oxide dielectric films 2 can be improved by twice to three times with respect to those of the simple tantalum dielectric film, and by twice with respect to those of the $SiO_2$ dielectric film.

TABLE 2

| Film Composition | Addition Amount (atomic %) | Film Thickness (angstrom) | Dielectric Breakdown Field $E_{bd}$ (MV/cm) | Relative Dielectric Constant "Er" | Figure of Merit |
|---|---|---|---|---|---|
| $Ta_2O_5$ | 6.3 | 230 | 0.87, 0.83 | 20.7, 20.7 | 18 |
| + | 15.7 | 280 | 0.44, 0.39 | 22.4, 22.1 | 9.4 |
| $Nb_2O_5$ | 27.8 | 970 | 1.2 | 26.7 | 33 |
|  | 36.4 | 220 | 0.26, 0.26 | 23.7, 23.7 | 6.2 |
| $Ta_2O_5$ | None | 220 | 1.9, 1.8 | 19.3, 18.5 | 35 |
|  |  | 710 | 1.5 | 21.0 | 32 |
| $Y_2O_3$ | None | 740 | 1.6 | 14.5 | 23 |
| $WO_3$ | None | 670 | 0.062 | 42 | 2.6 |
| $Nb_2O_3$ | None | 970 | 0.11 | 13.6 | 1.5 | they exhibited the dielectric breakdown field lower than that of the simple tantalum oxide dielectric film in a tungsten addition amount of 15.8 atomic % or more with respect to the sum of tantalum and tungsten therein taken as 100 atomic %.

Regarding the values of the relative dielectric constants, as illustrated in FIG. 5, when yttrium was the additive component, the present tantalum oxide dielectric films 2 exhibited the relative dielectric constants lower that that of the simple tantalum oxide dielectric film. Further, as illustrated in FIG. 6, when tungsten was the additive component, the present tantalum oxide dielectric films 2 exhibited the relative dielectric constants higher that that of the simple tantalum oxide dielectric film in the tungsten addition amount of 15.8% atomic % or more, but they exhibited the relative dielectric constants substantially equal to that of the simple tantalum dielectric film in the tungsten addition amount of 2.3 to 3.6 atomic %.

Moreover, regarding the figures of merit, the simple tantalum oxide dielectric film exhibited the maximum "K" value of 35 when the figure of merit is expressed by "K" (i.e., "$E_{bd}$" $\times$ "$\epsilon_r$" = "K"). As illustrated in FIG. 8, when yttrium was added, the maximum "K" value of the present tantalum oxide dielectric films 2 having similar film thicknesses increased to 67. and it was approximately twice that of the simple tantalum oxide dielectric film. Further, as illustrated in FIG. 9, when tungsten was added, the maximum "K" value of the present tantalum oxide dielectric films 2 was 75, and it was improved sharply with respect to that of the simple tantalum oxide dielectric film.

The following facts can be appreciated by comparing the figures of merit: When yttrium was added, the present tantalum oxide dielectric films 2 exhibited higher figures of merit than the simple tantalum oxide dielectric film did in the yttrium addition amount of 8 to 32 atomic % with respect to the sum of tantalum and yttrium therein taken as 100 atomic %. Further, when tungsten was added, the present tantalum oxide dielectric films 2 exhibited higher figures of merit than the simple tantalum oxide dielectric film did in the tungsten addition amount of 2 to 4 atomic % with respect to the sum of tantalum and tungsten therein taken as 100 atomic %. Accordingly, upgraded performances can be expected from the present dielectric films 2 when yt- As summarized in Table 2 above and as illustrated in FIG. 7, when niobium was the additive component, the values of the relative dielectric constant "$\epsilon_r$" of the present tantalum oxide dielectric films 2 were higher than that of the simple tantalum oxide dielectric film, but, as illustrated in FIG. 4, the values of the dielectric breakdown field $E_{bd}$ of the present tantalum oxide dielectric films 2 were smaller than that of the simple tantalum oxide dielectric film. Accordingly, as illustrated in FIG. 10, the figures of merit, i.e., the products of the dielectric breakdown fields and the relative dielectric constants, of the present tantalum oxide dielectric films 2 including $Nb_2O_5$ were smaller than that of the simple tantalum oxide dielectric film, because the smaller dielectric breakdown fields contributed more to the figures of merit.

Hence, in the case of the present tantalum oxide dielectric film 2 with niobium added, the present tantalum oxide dielectric film 2 can be put into practical applications when niobium is compounded in an addition amount, which allows to increase the relative dielectric constant "$\epsilon_r$," and which enables to keep the dielectric breakdown field to 1 MV/cm or more. For example, it is preferred that niobium is added into the simple tantalum oxide dielectric film in a trace amount of 6 to 20 atomic % with respect to the sum of tantalum and niobium therein taken as 100 atomic %. With this niobium addition amount, the present tantalum oxide dielectric film 2 including $Nb_2O_5$ can be used in the EL display devices, the EC display devices, the LSI circuits or the like which focus mainly on the improvements on the relative dielectric constants "$\epsilon_r$."

Application Example No. 1

Figure 11:
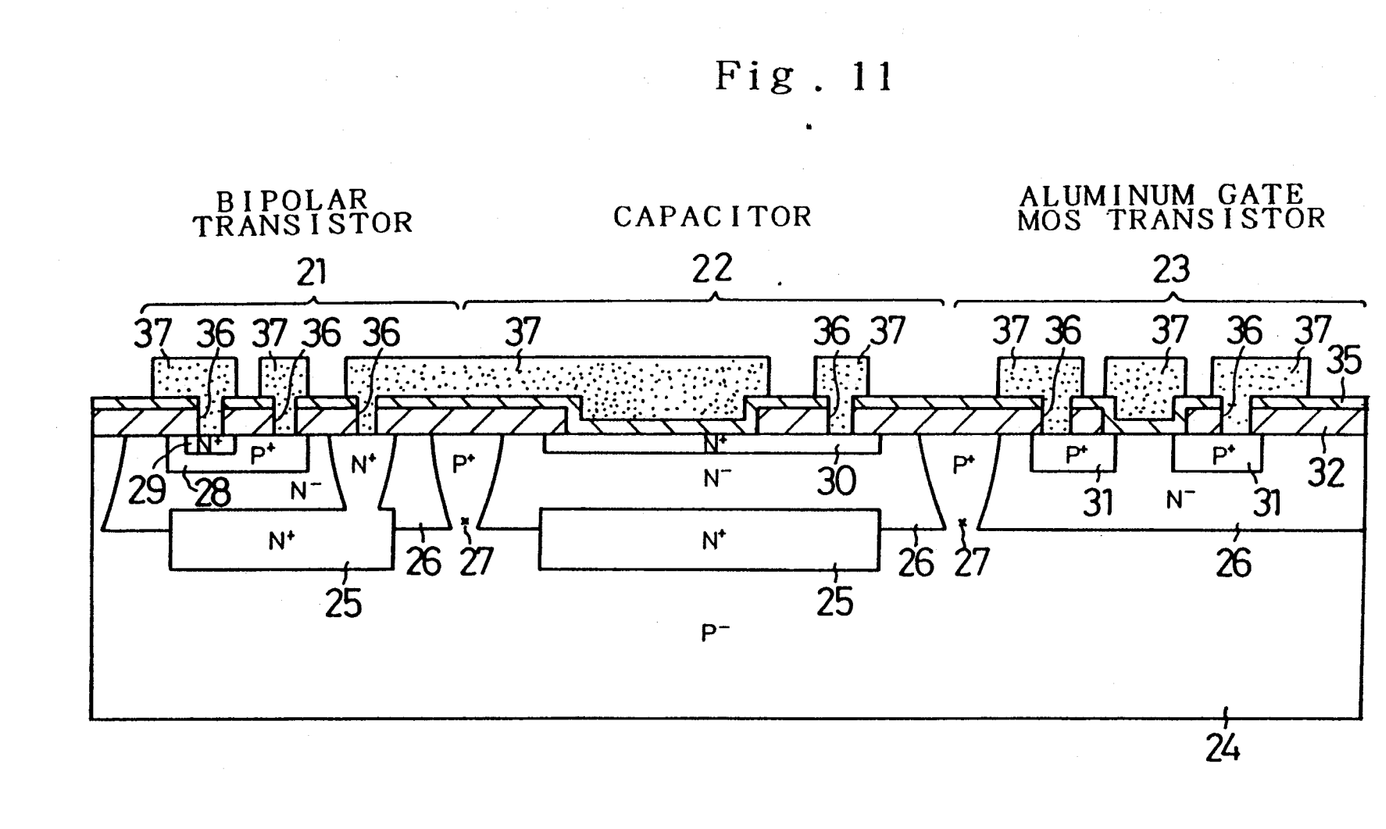
FIG. 11 is a schematic cross sectional view of an example of a semiconductor device to which the tantalum oxide dielectric film according to the present invention is applied.

FIG. 11 illustrates a semiconductor device which employed the tantalum oxide dielectric film including $WO_3$ according to the present invention as a dielectric film of its capacitor. This semiconductor device comprised and integrated a bipolar transistor 21, a capacitor 22 and an aluminum gate metal oxide semiconductor (hereinafter abbreviated to "MOS") transistor 23.

Figure 12:
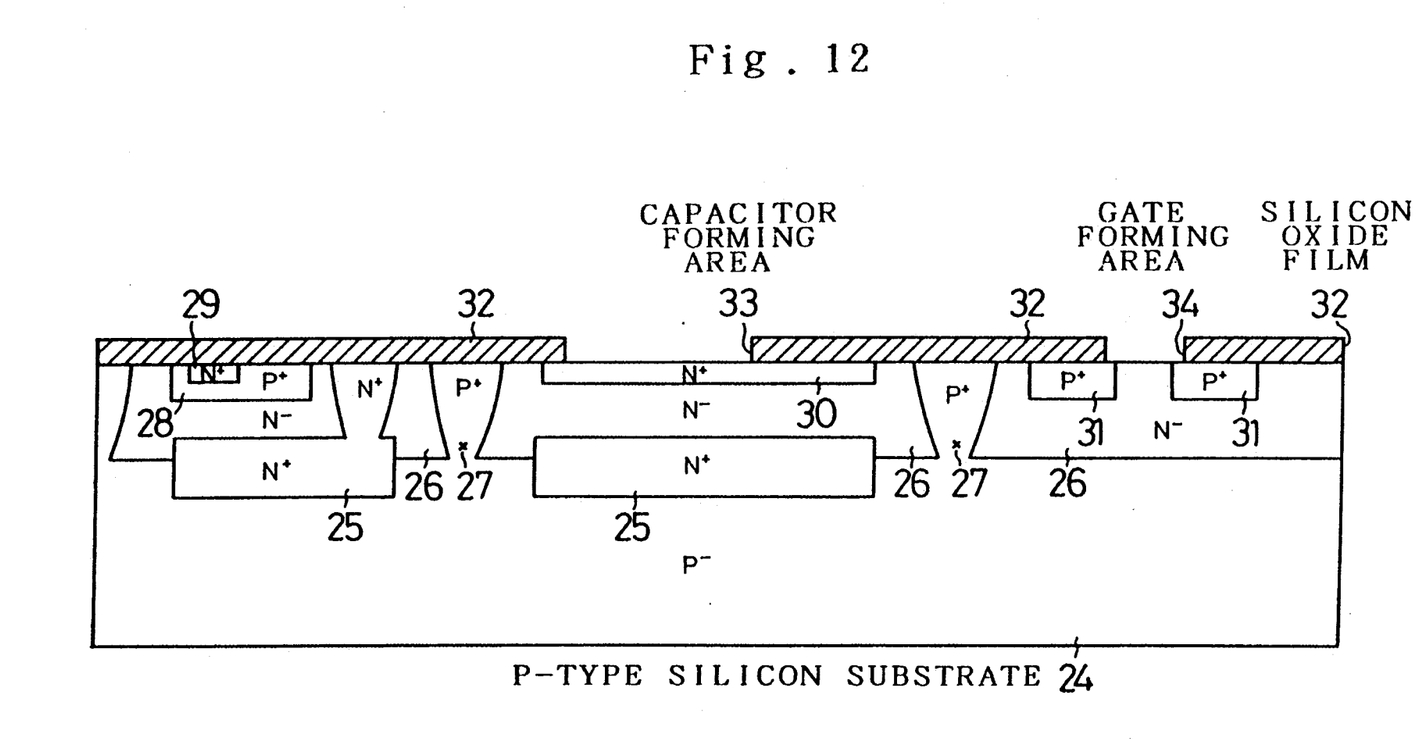
FIG. 12 is a schematic cross sectional view for describing a process for manufacturing the semiconductor device illustrated in FIG. 11 and illustrates the semiconductor device before the present tantalum oxide dielectric film is formed.
Figure 13:
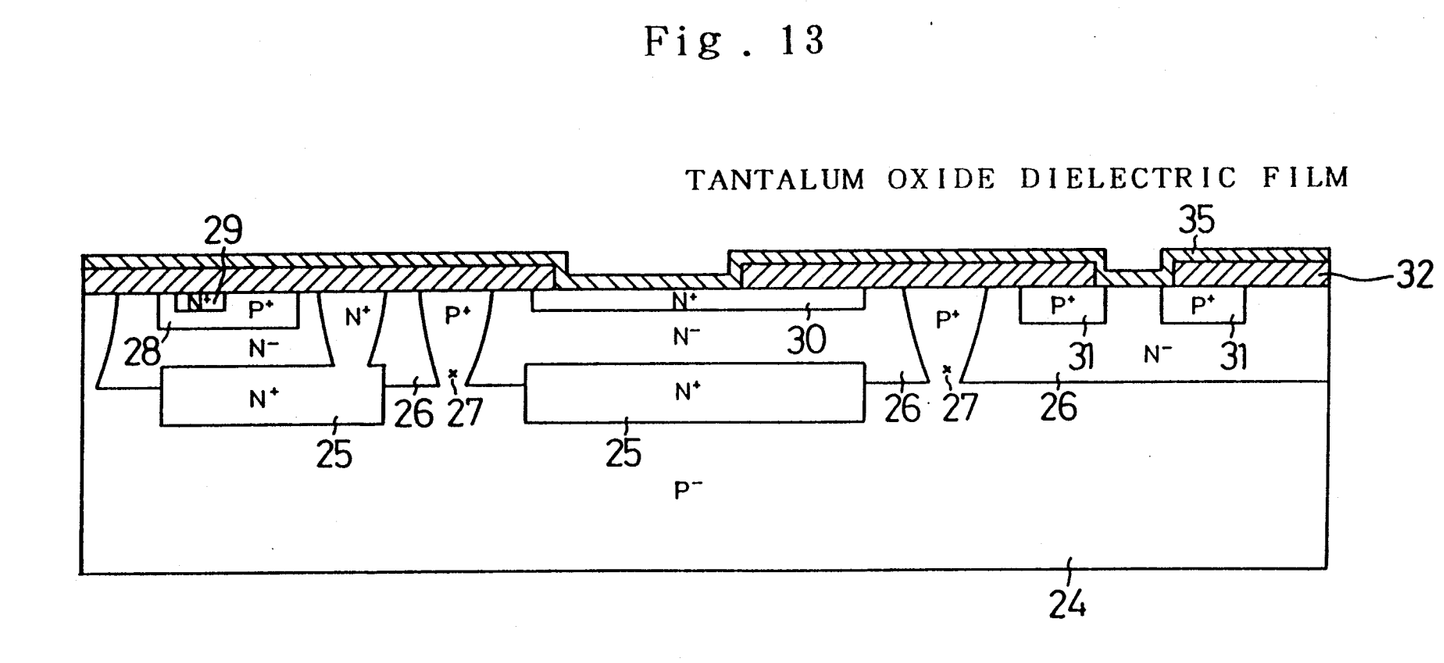
FIG. 13 is a schematic cross sectional view for describing another process for manufacturing the semiconductor device illustrated in FIG. 11 and illustrates the semiconductor device after the present tantalum oxide dielectric film is formed.

FIGS. 12 and 13 illustrate the production processes of the semiconductor device illustrated in FIG. 11. In FIG. 12, the semiconductor device is illustrated in a schematic cross sectional view, and it has been subjected to a photoetching process. As illustrated in FIG.

12, there were formed N+ buried-layers 25, N− epitaxial layers 26, isolation diffusion layers 27, a base diffusion layer 28, an emitter diffusion layer 29, an N+ layer 30 of the capacitor 22, and source-drain diffusion layers 31 on a p-type semiconductor silicon substrate 24. Further, prior to the photo-etching process, a silicon oxide film 32 was formed as an insulating film on all over the surface of the p-type semiconductor substrate 24 with all of the above-described layers formed. Furthermore, the parts of the silicon oxide film 32 were removed by photo-etching, parts which were to be a capacitor forming area 33 and a gate area of the aluminum gate MOS transistor 23.

As illustrated in FIG. 13, after the photo-etching process, the present tantalum oxide dielectric film 35 including tungsten oxide was formed as a dielectric film of the semiconductor device on all over the surfaces of the substrate 24 illustrated in FIG. 12 by radio frequency magnetron sputtering in a thickness of 4000 angstroms. Thereafter, the semiconductor device was heat treated at a temperature of 400° to 900° C. depending on the requirements. Moreover, as illustrated in FIG. 11, contact holes 36 and aluminum wiring layers 37 were formed in the present tantalum oxide dielectric film 35 and in silicon oxide film 32. Thus, the semiconductor device could be manufactured, semiconductor device which integrated the bipolar transistor 21, the capacitor 22 and the aluminum gate MOS transistor 23 as illustrated in FIG. 11.

Since this semiconductor device employed the present tantalum oxide dielectric film 35, which included tungsten oxide and which had a high insulation property, as its dielectric film, the bipolar transistor 21, the capacitor 22 having a large capacity, and the aluminum gate MOS transistor 23 could be integrated in the semiconductor device. In particular, since the portions of the semiconductor device corresponding to the large capacity capacitor 22 exhibited a higher dielectric constant as well as a lesser leakage current, and since it had a thinner film thickness, the semiconductor device could be compactified by employing the present tantalum oxide dielectric film 35 including tungsten oxide.

In addition, since the present tantalum oxide film including tungsten oxide is superior in terms of the performances, it can be integrated with the other transistors. Accordingly, ICs which have high insulating properties can be formed by using the present tantalum oxide film including tungsten oxide, and such ICs are expected to be used in highly integrated memory devices, bipolar complementary metal oxide semiconductor (i.e., BiCMOS) devices which are required to exhibit high insulation properties. Although the applications of the present tantalum oxide film including tungsten oxide to semiconductors have been described so far, it is readily appreciated from the foregoing descriptions that the identical advantageous effects can be obtained by applying the present tantalum oxide film including yttrium oxide to the semiconductors.

Application Example No. 2

Figure 14:
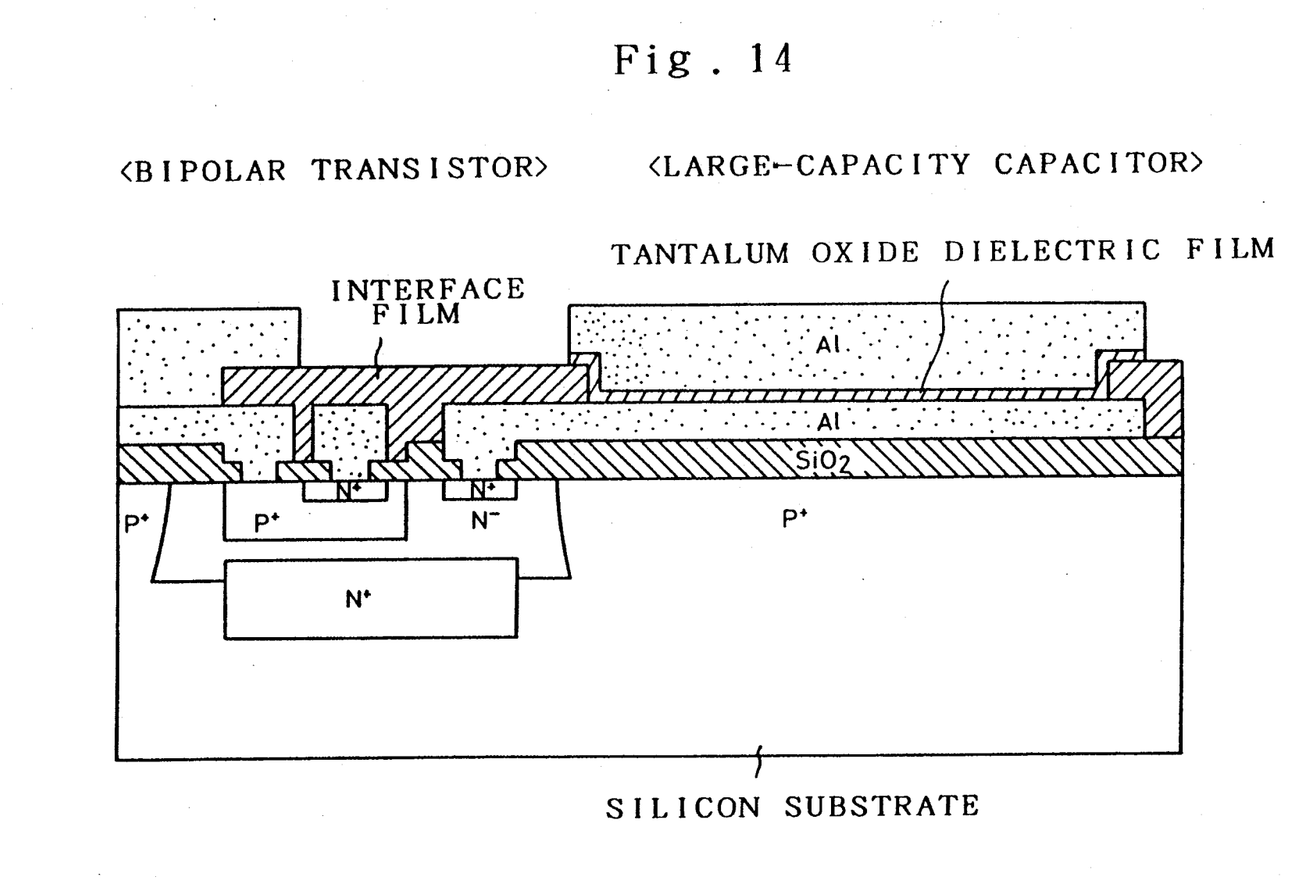
FIG. 14 is a schematic cross sectional view for describing another example of a semiconductor device to which the tantalum oxide dielectric film according to the present invention is applied and illustrates a bipolar integrated circuit (hereinafter abbreviated to "IC") in which the present tantalum oxide dielectric film is integrated as a constituent member of a high capacity capacitor.

FIG. 14 illustrates a semiconductor device to which the tantalum oxide dielectric film including yttrium oxide or tungsten oxide according to the present invention was applied. Contrary to the semiconductor illustrated in FIG. 11, no aluminum gate MOS transistor 23 was formed in this semiconductor device, but a large capacity capacitor was integrated with a bipolar transistor therein. Accordingly, when a dielectric film of the capacitor was formed with the present tantalum oxide dielectric film which included yttrium oxide or tungsten oxide and which exhibited a high insulation property, the capacitor could be integrated in the semiconductor device without ever increasing the thickness of the dielectric film. Since ICs, which comprises the present tantalum oxide dielectric film including yttrium oxide or tungsten oxide, obviates the necessity of externally assembling a large capacity capacitor, there is provided an advantageous effect that the ICs can be down-sized.

Having now fully described the present invention, it will be apparent to one of ordinary skill in the art that many changes and modifications can be made thereto without departing from the spirit or scope of the present invention as set forth herein including the appended claims.

What is claimed is:

1. A tantalum oxide dielectric film, consisting essentially of:
   tantalum oxide ($Ta_2O_5$) as a major component; and
   one oxide selected from the group consisting of yttrium oxide ($Y_2O_3$) and tungsten oxide ($WO_3$), wherein said tantalum oxide dielectric film contains yttrium or tungsten in an amount of 8 to 32 atomic % or 2 to 15 atomic %, respectively, relative to the sum of tantalum and yttrium/tungsten therein taken as 100 atomic %.

2. The tantalum oxide dielectric film according to claim 1, wherein said tantalum oxide dielectric film includes tungsten in an amount of 2 to 4 atomic % when the sum of tantalum and tungsten therein is taken as 100 atomic %.

3. The tantalum oxide dielectric film according to claim 1, wherein a thickness thereof is not more than 4000 angstroms.

4. The tantalum oxide dielectric film according to claim 3, wherein a thickness thereof falls in a range of 100 to 1000 angstroms.

5. The tantalum oxide dielectric film according to claim 4, wherein said thickness thereof falls in a range of 700 to 1000 angstroms.

6. The tantalum oxide dielectric film according to claim 1, wherein said tantalum oxide dielectric film is employed in an LSI circuit.

7. The tantalum oxide dielectric film according to claim 1, wherein said tantalum oxide dielectric film is employed in an EL display device.

8. The tantalum oxide dielectric film according to claim 1, wherein said tantalum oxide dielectric film is employed in an EC display device.

* * * * *